United States Patent
Ishii

(10) Patent No.: US 11,270,895 B2
(45) Date of Patent: Mar. 8, 2022

(54) GAS INTRODUCTION STRUCTURE, TREATMENT APPARATUS, AND TREATMENT METHOD

(71) Applicant: TOKYO ELECTRON LIMITED, Tokyo (JP)

(72) Inventor: Katsutoshi Ishii, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 141 days.

(21) Appl. No.: 16/726,638

(22) Filed: Dec. 24, 2019

(65) Prior Publication Data
US 2020/0211866 A1 Jul. 2, 2020

(30) Foreign Application Priority Data
Dec. 28, 2018 (JP) .............................. JP2018-248239

(51) Int. Cl.
*H01L 21/67* (2006.01)
*H01L 21/311* (2006.01)
*H01L 21/02* (2006.01)

(52) U.S. Cl.
CPC .. *H01L 21/67017* (2013.01); *H01L 21/02164* (2013.01); *H01L 21/02271* (2013.01); *H01L 21/31116* (2013.01)

(58) Field of Classification Search
CPC ......... H01L 21/67017; H01L 21/31116; H01L 21/02271; H01L 21/02164; H01L 21/67109; H01L 21/67069; H01L 21/67098; C23C 16/45568; C23C 16/45578
USPC .......................... 118/715; 156/345.33–345.34
See application file for complete search history.

(56) References Cited

U.S. PATENT DOCUMENTS

2006/0289401 A1* 12/2006 Kobayashi ........ C23C 16/45568
219/121.43
2009/0203227 A1* 8/2009 Hasebe ............. H01L 21/02219
438/787

FOREIGN PATENT DOCUMENTS

JP 2000-058530 A 2/2000

* cited by examiner

*Primary Examiner* — Rudy Zervigon
(74) *Attorney, Agent, or Firm* — Nath, Goldberg & Meyer; Jerald L. Meyer; Tanya E. Harkins

(57) ABSTRACT

A gas introduction structure includes: a gas introduction pipe inserted in a process chamber; and a discharge part covering an end portion of the gas introduction pipe at a side of the process chamber, and configured to discharge a gas supplied to the gas introduction pipe into the process chamber, wherein the discharge part includes a porous portion formed of a porous body, and a dense portion disposed at a location closer to a leading end of the discharge part than the porous portion and having a porosity lower than that of the porous portion.

16 Claims, 4 Drawing Sheets

GAS INTRODUCTION STRUCTURE, TREATMENT APPARATUS, AND TREATMENT METHOD

CROSS-REFERENCE TO RELATED APPLICATION

This application is based upon and claims the benefit of priority from Japanese Patent Application No. 2018-248239, filed on Dec. 28, 2018, the entire contents of which are incorporated herein by reference.

TECHNICAL FIELD

The present disclosure relates to a gas introduction structure, a treatment apparatus, and a treatment method.

BACKGROUND

It is a known technology that by providing a porous part to cover a gas inlet at a leading end portion of a quartz pipe for introducing a purge gas into a vacuum chamber, particles are suppressed from being drawn up when the purge gas is supplied from the quartz pipe into the vacuum chamber to return the interior of the vacuum chamber to a normal pressure (see for example, Patent Document 1).

PRIOR ART DOCUMENT

Patent Document
Patent Document 1: Japanese laid-open publication No. 2000-58530

SUMMARY

An aspect of the present disclosure provides a gas introduction structure including: a gas introduction pipe inserted in a process chamber; and a discharge part covering an end portion of the gas introduction pipe at a side of the process chamber, and configured to discharge a gas supplied to the gas introduction pipe into the process chamber. The discharge part includes a porous portion formed of a porous body, and a dense portion disposed at a location closer to a leading end of the discharge part than the porous portion and having a porosity lower than that of the porous portion.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
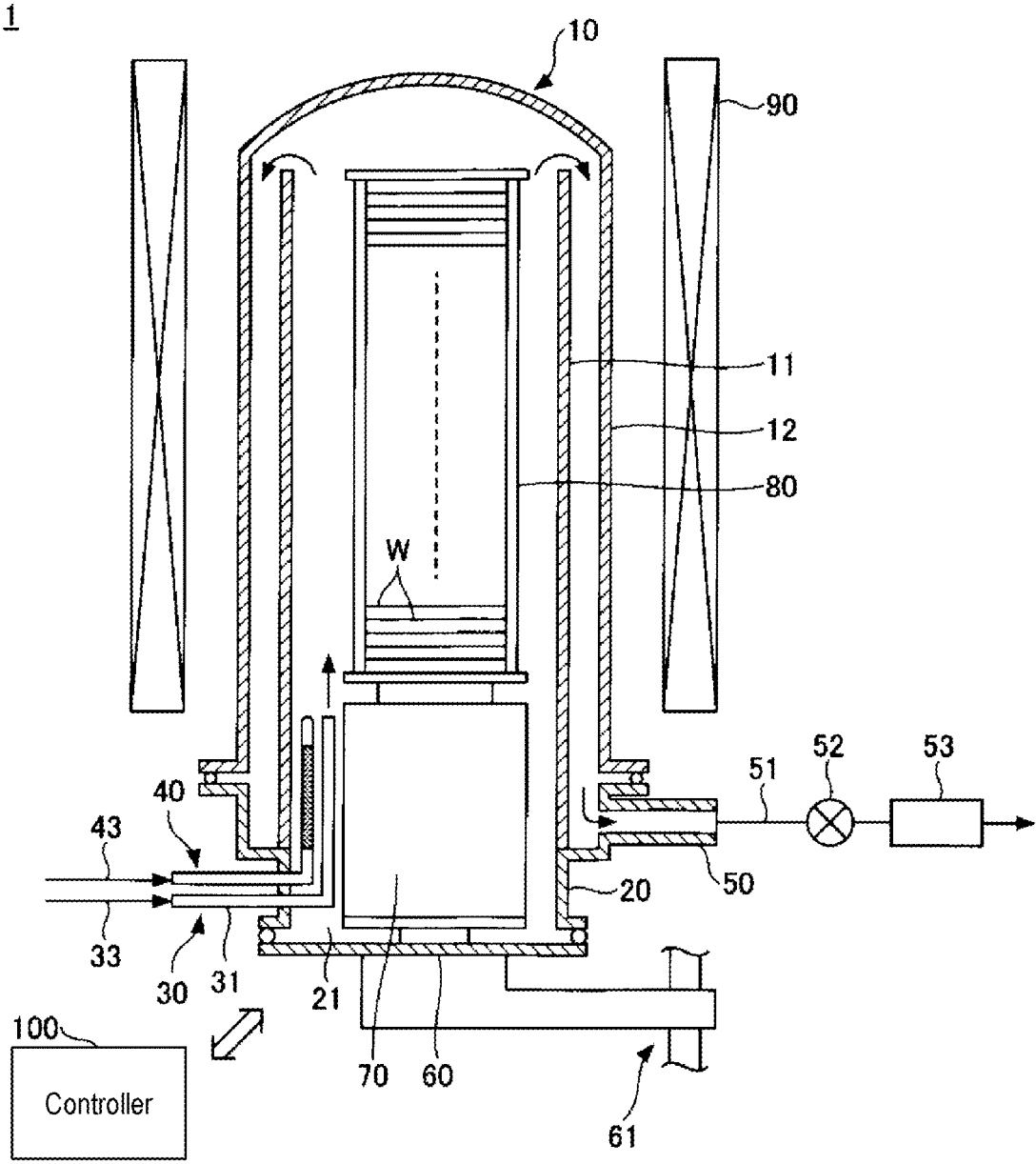
FIG. 1 is a view illustrating an example of a configuration of a treatment apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure, which are not restrictive, will be described with reference to the accompanying drawings. In the accompanying drawings, the same or corresponding members or components are denoted by the same or corresponding reference numerals, and the redundant description thereof will be omitted.

[Treatment Apparatus]

A treatment apparatus according to the present embodiment will be described with an example of a batch-type heat treatment apparatus in which a heat treatment can be performed on a plurality of substrates in a state where the substrates are held in multiple stages by a substrate holder in a process chamber. However, the treatment apparatus is not limited to the batch-type heat treatment apparatus, and may be also applied to, for example, a sheet-by-sheet type treatment apparatus. FIG. 1 illustrates an example of a configuration of a treatment apparatus.

As illustrated in FIG. 1, a heat treatment apparatus 1 has an overall shape which is longitudinally long and extends in a vertical direction. The heat treatment apparatus 1 has a process chamber 10 which is longitudinally long and extends in the vertical direction.

The process chamber 10 is formed of a heat-resistant material, such as quartz, silicon carbide, or the like. The process chamber 10 has a double tube structure which includes, for example, a cylindrical inner tube 11 and an outer tube 12 disposed concentrically and outward with respect to the inner tube 11 and having a ceiling. A lower end portion of the process chamber 10 is hermetically supported by a manifold 20 formed of, for example, stainless steel.

The manifold 20 is fixed to, for example, a base plate (not shown). Injectors 30 and 40 and a gas exhauster 50 are provided in the manifold 20.

The injector 30 is a process gas introduction part configured to introduce a process gas into the process chamber 10. The process gas includes a film-forming gas and an etching gas. The film-forming gas is a gas used when forming a film on a semiconductor wafer (hereinafter, referred to as "wafer W") which is a substrate received in the process chamber 10, and is selected according to a type of a film to be formed. Examples of the film-forming gas include a semiconductor source gas (e.g., a silicon-containing gas), a metal source gas (e.g., a titanium-containing gas), an oxidizing gas (e.g., an oxygen gas), and a reducing gas (e.g., a hydrogen gas and an ammonia gas), and the like. The etching gas is a gas used, for example, when etching a film formed on the wafer W received in the process chamber 10 or when etching and removing deposits formed in the process chamber 10, and is selected according to a film to be etched or a type of deposits. Examples of the etching gas include a fluorine-containing gas such as a fluorine gas, a hydrogen fluoride gas, a chlorine trifluoride gas, and the like, or a chlorine-containing gas. For example, in a case of forming a silicon oxide film on the wafer W, a silicon-containing gas and an oxidizing gas may be used as a film-forming gas. Further, in a case of removing a silicon oxide film deposited in the process chamber 10, a fluorine-containing gas may be used as an etching gas. Further, the injector 30 may introduce an inert gas such as a nitrogen gas and an argon gas, in addition to the process gas.

The injector 30 includes a gas introduction pipe 31, which is inserted into the process chamber 10 at a lower portion of the process chamber 10 through the manifold 20 and is bent in an L-shape so as to extend upward along a side wall of the process chamber 10. The gas introduction pipe 31 is formed of, for example, quartz. An end portion of the gas introduction pipe 31 at a side of the process chamber 10 has an opening, and the process gas supplied to the gas introduction pipe 31 is introduced into the process chamber 10 from the opening. Alternatively, the injector 30 may have a shape which is not bent in an L-shape and extends horizontally in the process chamber 10.

A pipe 33 configured to introduce the process gas is connected to the injector 30. A flow rate controller such as a mass flow controller configured to control a flow rate of a gas and a valve configured to control a supply and stop of the gas are installed in the pipe 33.

The injector 40 is a purge gas introduction part configured to introduce a purge gas into the process chamber 10. The purge gas is an inert gas, such as a nitrogen gas, an argon gas, or the like. The purge gas is introduced into the process chamber 10 from the injector 40 when a process gas atmosphere in the process chamber 10 is replaced by an inert gas atmosphere by quickly discharging the process gas remaining in the process chamber 10 through the gas exhauster 50. Further, the purge gas is introduced into the process chamber 10 from the injector 40 when a reduced pressure atmosphere in the process chamber 10 is returned to normal pressure. In addition, the purge gas is introduced into the process chamber 10 from the injector 40 when the film formed on the wafer W received in the process chamber 10 is etched by introducing the etching gas into the process chamber 10 from the injector 30. Further, the purge gas is introduced into the process chamber 10 from the injector 40 when the deposits formed in the process chamber 10 are etched and removed by introducing the etching gas into the process chamber 10 from the injector 30.

Figure 2:
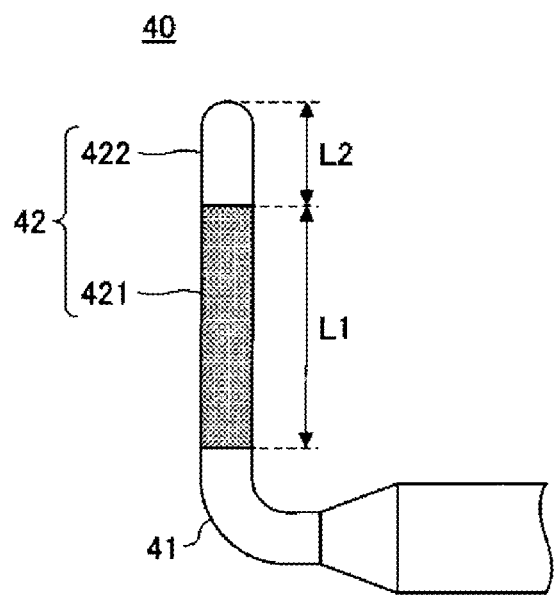
FIG. 2 is a view illustrating an example of a configuration of an injector.
Figure 3:
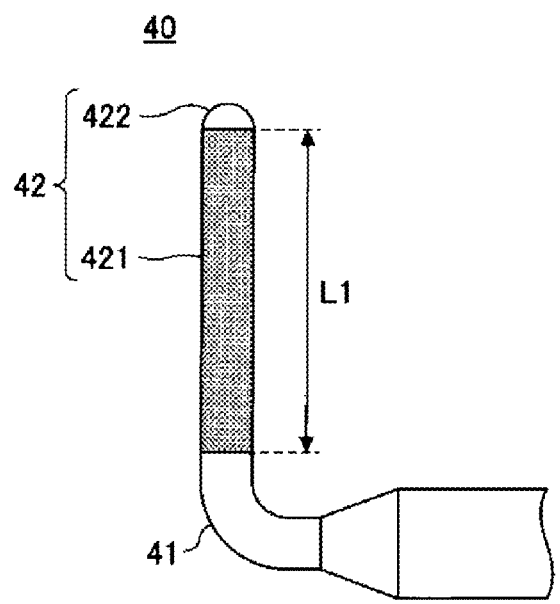
FIG. 3 is a view illustrating an example of a configuration of an injector.

FIGS. 2 and 3 are diagrams illustrating an example of the injector 40. As illustrated in FIGS. 2 and 3, the injector 40 has a gas introduction pipe 41 and a discharge part 42.

The gas introduction pipe 41 is inserted into the process chamber 10 from a lower portion of the process chamber 10 through the manifold 20, and is bent in an L-shape to extend upward along the side wall of the process chamber 10. The gas introduction pipe 41 is formed of, for example, a quartz pipe. An end portion of the gas introduction pipe 41 at a side of the process chamber 10 has an opening. Alternatively, the gas introduction pipe 41 may have a shape which is not bent in an L-shape and extends horizontally in the process chamber 10.

The discharge part 42 covers the opening formed in the end portion of the gas introduction pipe 41 at the side of the process chamber 10 and discharges the purge gas supplied to the gas introduction pipe 41 into the process chamber 10. The discharge part 42 is, for example, welded to the end portion of the gas introduction pipe 41 at the side of the process chamber 10. The discharge part 42 includes a porous portion 421 and a dense portion 422.

The porous portion 421 is attached to the end portion of the gas introduction pipe 41 at the side of the process chamber 10 and is formed of a porous body. The porous body is formed of, for example, a quartz-glass porous body. The quartz-glass porous body may be obtained by sintering quartz-glass fine particles. A length L1 of the porous portion 421 may be, for example, 25 to 40 mm.

The dense portion 422 is provided at a location closer to a leading end of the discharge part 42 than the porous portion 421, and is formed of a material having a porosity lower than the porous portion 421. For example, a densified quartz-glass porous body obtained by sintering the quartz-glass porous body used for the porous portion 421 may be used as the material having a porosity lower than the porous portion 421. In this case, after installing the quartz-glass porous body so as to cover the end portion of the gas introduction pipe 41 at the side of the process chamber 10, and then sintering a part of a leading end portion of the quartz-glass porous body, a non-sintered part forms the porous portion 421 and the sintered part forms the dense portion 422. When the dense portion 422 is formed by sintering the quartz-glass porous body as described above, an outer diameter of the dense portion 422 becomes smaller than a diameter of the porous portion 421 because the sintered part contracts. Further, as a material having a porosity lower than the porous portion 421, for example, a quartz bar, which is of the same material as that of the gas introduction pipe 41, may be used. In this case, for example, the dense portion 422 may be formed by welding the quartz bar to the end portion of the porous portion 421. As illustrated in FIG. 2, for example, the dense portion 422 may be a leading end portion of the discharge part 42 having a predetermine length of L2. In this case, the length L2 of the dense portion 422 may be shorter than the length L1 of the porous portion 421. Further, as illustrated in FIG. 3, for example, the dense portion 422 may be formed only at a curved surface shaped R portion in the leading end of the discharge part 42.

A pipe 43 configured to introduce the purge gas is connected to the injector 40. A flow rate controller such as a mass flow controller configured to control a flow rate of a gas and a valve configured to control a supply and stop of the gas are installed in the pipe 43.

The gas exhauster 50 exhausts the interior of the process chamber 10. A pipe 51 is connected to the gas exhauster 50. An open-degree adjustable valve 52 and a vacuum pump 53, which can control depressurization of the interior of the process chamber 10, are installed in the pipe 51.

A furnace port 21 is formed at the lower end portion of the manifold 20. A disk-like lid 60 formed of, for example, stainless steel is provided at the furnace port 21.

The lid 60 is provided to be movable upward and downward by an elevation mechanism 61, and is configured to hermetically seal the furnace port 21. A heat-insulating unit 70 formed of, for example, a quartz heat-insulating plate is installed on the lid 60.

A wafer boat 80 formed of, for example, quartz is placed on the heat-insulating unit 70. The wafer boat 80 horizontally holds a plurality of wafers W in multiple stages at predetermined intervals.

The wafer boat 80 is loaded into and received in the process chamber 10 by an upward movement of the lid 60 using the elevation mechanism 61. Further, the wafer boat 80 is unloaded from the process chamber 10 by a downward movement of the lid 60. The wafer boat 80 has a groove structure in which a plurality of slots (support grooves) is formed in the longitudinal direction thereof, and the wafers W are horizontally placed in the slots, respectively, with vertical intervals. The plurality of wafers placed on the wafer boat 80 forms a single batch, and various types of heat treatment are performed in batch units.

A heater 90 is arranged outside the process chamber 10. The heater 90 has, for example, a cylindrical shape, and heats the process chamber 10 to a predetermined temperature.

The heat treatment apparatus 1 includes a controller 100 configured, for example, by a computer. The controller 100 includes a program, a memory, and a data processor including a CPU. Commands (individual steps) for transmitting control signals from the controller 100 to each component of the heat treatment apparatus 1 so as to perform a predetermined treatment are included in the program. The program is stored in a computer storage medium, such as a flexible disk, a compact disk, a hard disk, a magneto-optical (MO) disk, and a memory card, and is installed in the controller 100.

Further, in the above example, although the case where the heat treatment apparatus 1 includes two injectors 30 and 40 was discussed, the heat treatment apparatus 1 may further include a separate injector in addition to the injectors 30 and 40. In the case where the heat treatment apparatus 1 include a separate injector, the separate injector may be configured, for example, to introduce a reducing gas. In this case, the separate injector may have the same structure as that of the injector 40. That is, the separate injector may have a gas introduction pipe and a discharge part including a porous portion and a dense portion. Alternatively, the separate injector may have a gas introduction pipe without a discharge part that includes a porous portion and a dense portion.

[Treatment Method]

One example of a treatment method using the heat treatment apparatus 1 of FIG. 1 will be described. Hereinafter, a description will be made on a case of performing a so-called "chamber cleaning process" in which in a state where no wafer W is received in the process chamber 10, an etching gas is introduced into the process chamber 10 from the injector 30 and deposits in the process chamber 10 are etched and removed.

First, in a state where no wafer W is received in the process chamber 10, the interior of the process chamber 10 is depressurized. Subsequently, an etching gas is introduced from the injector 30 and a purge gas is introduced from the injector 40. Therefore, deposits deposited in the process chamber 10 can be etched by the etching gas and removed. At this time, since the injector 40 is also exposed to the etching gas, there is a concern that the porous portion 421 having a large surface area may be etched. However, in the heat treatment apparatus 1 of the present embodiment, the dense portion 422 is formed at the leading end portion of the discharge part 42, from which it is difficult for the purge gas to be discharged. Thus, even when the flow rate of the purge gas supplied to the injector 40 is relatively small, the purge gas can be easily discharged from the porous portion 421, compared with the dense portion 422 formed at the leading end portion of the discharge part 42. Therefore, since the purge gas suppresses the porous portion 421 from being exposed to the etching gas, the porous portion 421 can be suppressed from being etched by the etching gas. Although the dense portion 422 may be exposed to the etching gas, the dense portion 422 has a porosity lower than that of the porous portion 421, that is, has a surface area smaller than that of the porous portion 421. Thus, even when the dense portion 422 is exposed to the etching gas, the dense portion 422 is not etched by the etching gas or it is difficult for the dense portion 422 to be etched by the etching gas. Therefore, even when the porous portion 421 is provided, the injector 40 can be suppressed from being etched by the etching gas.

Further, in the above example, although the case of performing the chamber cleaning process as one example of the treatment method was discussed, the present disclosure is not limited thereto. For example, the present disclosure may also be applied to a process in which in a state where the wafer W is received in the process chamber 10, an etching gas is introduced into the process chamber 10 from the injector 30 and the wafer W or a film formed on the wafer W is etched.

Operational Effects

Operational effects exhibited by the above-described heat treatment apparatus 1 will be described.

The heat treatment apparatus 1 has the discharge part 42, which covers an opening formed in the end portion of the gas introduction pipe 41 at the side of the process chamber 10 and discharges a purge gas supplied in the gas introduction pipe 41 into the process chamber 10, and the discharge part 42 includes the porous portion 421 formed of a porous body. Thus, a purge gas supplied to the gas introduction pipe 41 is introduced into the process chamber 10 through the discharge part 42 including the porous portion 421. Therefore, even when the flow rate of the purge gas is increased, the flow of the purge gas is dispersed and the velocity of the flow is suppressed, which makes it possible to introduce the purge gas into the process chamber 10 within a short time while suppressing the particles from being drawn up in the process chamber 10. As a result, it is possible to replace a process gas atmosphere in the process chamber 10 by an inert gas atmosphere within a short time while suppressing the particles from being drawn up in the process chamber 10. Further, a reduced-pressure atmosphere in the process chamber 10 can be returned to normal pressure within a short time.

Further, according to the heat treatment apparatus 1, the discharge part 42 of the injector 40 includes the dense portion 422, which is provided at a location closer to the leading end of the discharge part 42 than the porous portion 421 and has a porosity lower than that of the porous portion 421. Therefore, when the etching gas is introduced into the process chamber 10 from the injector 30, the injector 40 can be suppressed from being etched by the etching gas even when the injector 40 is exposed to the etching gas. The reason will be described below.

First, a case where the discharge part 42 of the injector 40 does not include the dense portion 422, that is, the entirety of the discharge part 42 is formed of the porous portion 421, is considered. In this case, when exposed to an etching gas introduced in the process chamber 10 from the injector 30, the porous portion 421 having a large surface area may be easily etched by the etching gas. Thus, when the etching gas is introduced into the process chamber 10 from the injector 30, exposure of the porous portion 421 to the etching gas is suppressed by discharging a purge gas from the porous portion 421 of the injector 40.

However, when the flow rate of the purge gas is small, there is a concern that the purge gas may not be evenly spread to the leading end portion of the porous portion 421 and thus may not be discharged from the leading end portion of the porous portion 421. Also, when a pressure loss of the porous portion 421 is small, there is a concern that the purge gas may not be discharged from the leading end portion of the porous portion 421. When the purge gas is not discharged from the leading end portion of the porous portion 421 as described above, the leading end portion of the porous portion 421 is exposed to and etched by the etching gas. When the leading end portion of the porous portion 421 is etched, the leading end portion of the porous portion 421 may serve as a particle source or a hole may be formed in the leading end portion of the porous portion 421. Thus, it is necessary to increase the flow rate of the purge gas supplied to the injector 40 such that the purge gas is discharged from the leading end portion of the porous portion 421. However, increasing the flow rate of the purge gas causes a problem that a large amount of the purge gas is used. Further, it may not be desirable to introduce a purge gas into the process chamber 10 at a large flow rate when the etching gas is introduced into the process chamber 10.

In contrast, in the heat treatment apparatus 1 of the present embodiment, the dense portion 422 is formed at the leading end portion of the discharge part 42, from which it is difficult for the purge gas to be discharged. Thus, even when the flow rate of the purge gas supplied to the injector 40 is relatively small, the purge gas may be easily discharged from the porous portion 421, compared with the dense portion 422 formed at the leading end portion of the discharge part 42. Therefore, since the purge gas suppresses the porous portion 421 from being exposed to the etching gas, etching of the porous portion 421 by the etching gas may be suppressed. Although the dense portion 422 may be exposed to the etching gas, the dense portion 422 has a porosity lower than that of the porous portion 421, that is, the dense portion 422 has a surface area smaller than that of the porous portion 421. Thus, even when the dense portion 422 is exposed to the etching gas, the dense portion 422 is not etched by the etching gas, or it is difficult for the dense portion 422 to be etched by the etching gas. Therefore, even when the porous portion 421 is provided, etching of the injector 40 by the etching gas may be suppressed.

Experimental Examples

A state when a gas is discharged from the discharge part 42 by using the above-described injector 40 was evaluated by observing a state of bubbles generated when the discharge part 42 was immersed in ethanol and a nitrogen gas was discharged from the discharge part 42.

Figure 4:
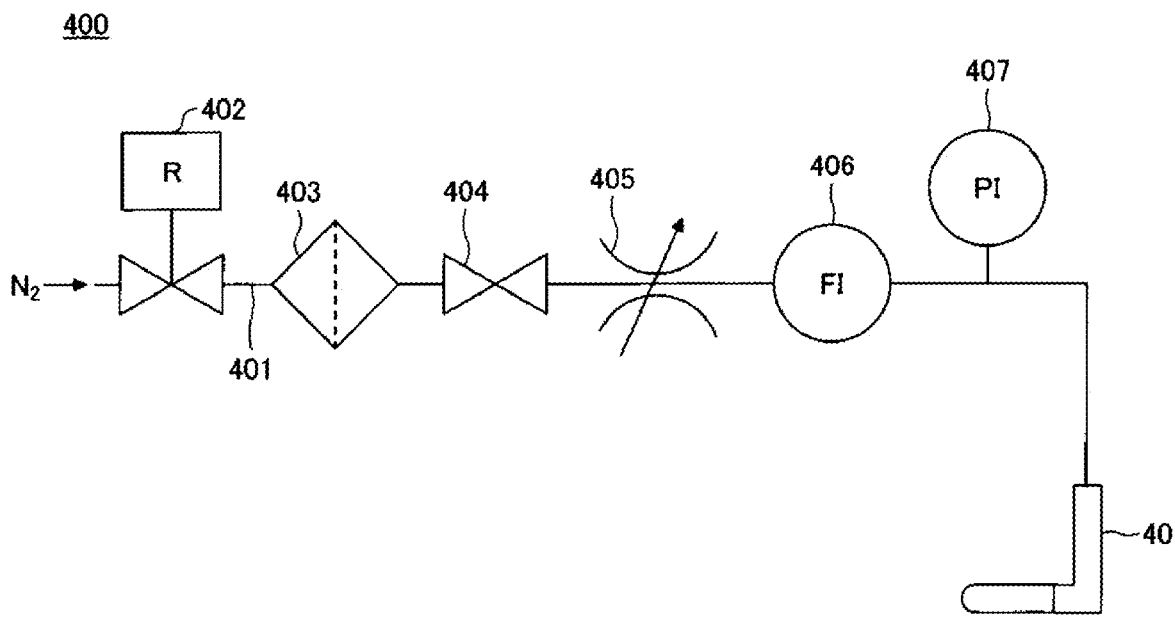
FIG. 4 is a diagram for explaining a pressure loss of an injector.

A gas introduction structure, in which the injector 40 has the gas introduction pipe 41 formed of quartz, the porous portion 421 formed of a quartz-glass porous body, and the dense portion 422 densified by sintering a quartz-glass porous body, was used. Further, two types of products, i.e., a high pressure loss product and a low pressure loss product, were used as the quartz-glass porous body. The classification into the high pressure loss product and the low pressure loss product was made based on a pressure measured using a measurement system illustrated in FIG. 4. FIG. 4 is a diagram for explaining a pressure loss of the injector 40.

As illustrated in FIG. 4, a measurement system 400 includes a gas line 401 as well as a pressure adjustor 402, a filter 403, a manual valve 404, a flow rate adjustment valve 405, a flowmeter 406, and a pressure gauge 407, which are installed in the gas line 401 in the order from the upstream side of the gas line 401. The injector 40 as a target of measuring the pressure loss is installed at the downstream side of the gas line 401.

When measuring the pressure loss, in a state where the injector 40 was installed at the downstream side of the gas line 401, a nitrogen ($N_2$) gas was supplied to the gas line 401 and the pressure adjustor 402 and the flow rate adjustment valve 405 were adjusted such that a value detected by the pressure gauge 407 becomes 10 kPa. Then, when the value detected by the pressure gauge 407 became 10 kPa, the flow rate of the nitrogen gas was measured by the flowmeter 406. The injector 40 was classified into the high pressure loss product when the flow rate measured by the flowmeter 406 was in a range from 6.1 to 6.7 L/min, and was classified as the low pressure loss product when the flow rate measured by the flowmeter 406 was in a range from 8.9 to 9.4 L/min.

Figure 5:
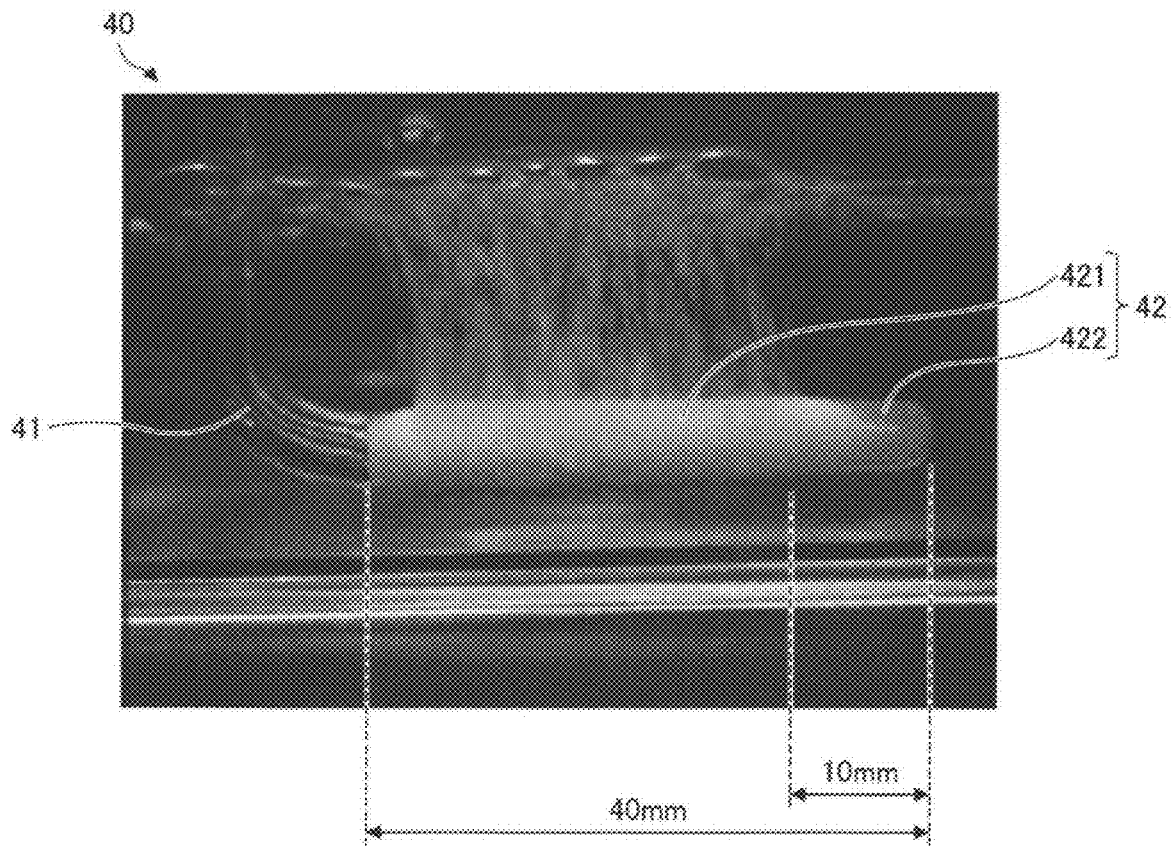
FIG. 5 is a view showing a result obtained when a gas was discharged by an injector including a dense portion at a leading end of a discharge part.

FIG. 5 illustrates a result obtained when a gas was discharged by the injector 40 including the dense portion 422 at the leading end portion of the discharge part 42. More specifically, FIG. 5 illustrates a result obtained when a nitrogen gas was supplied at a flow rate of 0.1 L/min to the injector 40 having the discharge part 42 in which the sum of the length of the porous portion 421 and the length of the dense portion 422 is 40 mm, and the length of the dense portion 422 is 10 mm.

As illustrated in FIG. 5, it was confirmed that, when the nitrogen gas was discharged by the injector 40, bubbles were discharged from the entirety of the porous portion 421 of the discharge part 42, that is, from a portion of the porous portion 421 at the side of the gas introduction pipe 41 to the leading end of the porous portion 421.

Figure 6:
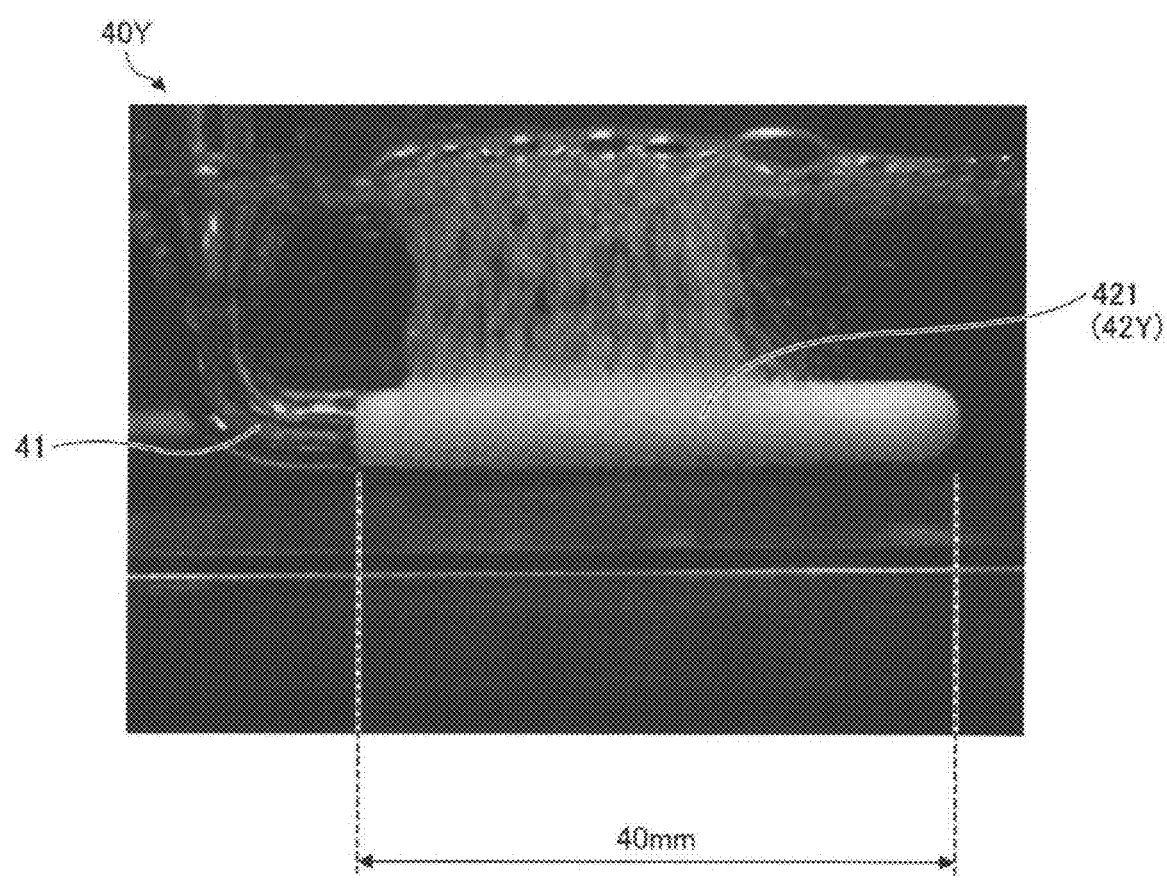
FIG. 6 is a view showing a result obtained when a gas was discharged by an injector which does not includes a dense portion at a leading end of a discharge part.

FIG. 6 illustrates a result obtained when a gas was discharged by an injector 40Y which does not include the dense portion 422 at the leading end portion of the discharge part 42. More specifically, FIG. 6 illustrates a result obtained when a nitrogen gas was supplied at a flow rate of 0.1 L/min to the injector 40Y having a discharge part 42Y in which the length of a porous portion 421 is 40 mm.

As illustrated in FIG. 6, it was confirmed that, when the nitrogen gas was discharged by the injector 40Y, bubbles were discharged from a portion of the porous portion 421 at the side of the gas introduction pipe 41, but no bubble was discharged from the leading end portion of the porous portion 421.

From the results illustrated in FIGS. 5 and 6, it is considered that by providing the dense portion 422 at the leading end portion of the discharge part 42, even when a nitrogen gas is discharged at a relatively small flow rate of 0.1 L/min, the etching gas is suppressed from coming in contact with the porous portion 421 by the nitrogen gas.

Next, a state of bubbles discharged from the porous portion 421 was evaluated when the length of the dense portion 422 of the injector 40, the type of the pressure loss of the dense portion 422 of the injector 40, and the flow rate of a nitrogen gas introduced into the injector 40 were changed.

With respect to the length of the dense portion 422, two conditions, which include a case where the dense portion 422 is formed at the R portion in the leading end of the discharge part 42 (hereinafter, referred to as "leading end R portion densification") and a case where the dense portion 422 is formed at a region within up to 10 mm distance from the leading end of the discharge part 42 (hereinafter, referred to as "leading end 10 mm densification"), were set.

With respect to the type of the pressure loss of the dense portion 422 of the injector 40, two conditions, which include the high pressure loss product and the low pressure loss product, were set.

With respect to the flow rate of the nitrogen gas introduced into the injector 40, four conditions, which include 0.1 L/min, 0.2 L/min, 0.4 L/min, and 0.8 L/min, were set.

The evaluation result is shown in Table 1 below.

TABLE 1

| | Densified portion | | | |
|---|---|---|---|---|
| | Leading end R portion densification | | Leading end 10 mm densification | |
| | Type of pressure loss | | | |
| | High pressure loss product | Low pressure loss product | High pressure loss product | Low pressure loss product |
| 0.1 L/min | ○ | X | ○ | ○ |
| 0.2 L/min | ○ | Δ | ○ | ○ |
| 0.4 L/min | ○ | ○ | ○ | ○ |
| 0.8 L/min | ○ | ○ | ○ | ○ |

○: Bubbles are entirely discharged even from the leading end of the porous portion
Δ: Almost no bubble is discharged from the leading end of the porous portion
X: No bubble is discharged from the leading end of the porous portion In Table 1, the symbol "0" indicates that bubbles were entirely discharged even from the leading end of the porous portion 421, the symbol "4" indicates that almost no bubble was discharged from the leading end of the porous portion 421, and the symbol "X" indicates that no bubble was discharged from the leading end of the porous portion 421.

As shown in Table 1, it was confirmed that, when the dense portion 422 was formed at the 10 mm portion of the leading end of the discharge part 42, in both cases where the type of the porous portion 421 was the high pressure loss product and where the type of the porous portion 421 was the low pressure loss product, bubbles were discharged from the entirety of the porous portion 421 including the leading end of the porous portion 421 regardless of the flow rate of the nitrogen gas.

In addition, it was confirmed that, when the dense portion 422 was formed at the R portion in the leading end of the discharge part 42 and when the type of the porous portion 421 was the high pressure loss product, bubbles were discharged from the entirety of the porous portion 421 including the leading end of the porous portion 421 regardless of the flow rate of the nitrogen gas. However, when the type of the porous portion 421 was the low pressure loss product, there was a case in which no bubble was discharged from the leading end of the porous portion 421 when the flow rate of the nitrogen gas was small. Specifically, when the flow rate of the nitrogen gas was 0.1 L/min, no bubble was discharged from the leading end of the porous portion 421. Further, when the flow rate of the nitrogen gas was 0.2 L/min, almost no bubble was discharged from the leading end of the porous portion 421.

From the above result, it is considered that when the flow rate of the nitrogen gas is reduced to be in a range of 0.1 L/min to 0.2 L/min, it may be desirable to form the dense portion 422 at a region within up to 10 mm distance from the leading end of the discharge part 42.

According to the present disclosure, it is possible to suppress a gas instruction pipe having a porous portion from being etched by an etching gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas introduction structure comprising: a gas introduction pipe inserted in a process chamber; and a discharge part covering an end portion of the gas introduction pipe at a side of the process chamber, and configured to discharge a gas supplied to the gas introduction pipe into the process chamber, wherein the discharge part comprises an installed porous portion formed of a porous body, and a dense portion disposed at a location closer to a leading end of the discharge part than the porous portion and having a porosity lower than that of the porous portion, wherein the porous body is formed of a quartz-glass porous body, wherein the dense portion is formed of a densified quartz-glass porous body obtained by sintering the quartz-glass porous body, and wherein, after installing the quartz-glass porous body covering the end portion of the gas introduction pipe, and then sintering a part of a leading end portion of the quartz-glass porous body, whereby a non-sintered part forms the porous portion and a sintered part forms the dense portion.

2. The gas introduction structure of claim 1, wherein the dense portion is formed of a porous body having a porosity lower than that of the porous portion.

3. The gas introduction structure of claim 2, wherein a length of the dense portion is smaller than a length of the porous portion.

4. The gas introduction structure of claim 3, wherein an outer diameter of the dense portion is smaller than an outer diameter of the porous portion.

5. The gas introduction structure of claim 4, wherein a length of the porous portion is 25 mm to 40 mm.

6. The gas introduction structure of claim 1, wherein the dense portion is formed of a same material as that of the gas introduction pipe.

7. The gas introduction structure of claim 1, wherein a length of the dense portion is smaller than a length of the porous portion.

8. The gas introduction structure of claim 1, wherein an outer diameter of the dense portion is smaller than an outer diameter of the porous portion.

9. The gas introduction structure of claim 1, wherein a length of the porous portion is 25 mm to 40 mm.

10. The gas introduction structure of claim 1, wherein the gas introduction pipe is formed of a quartz pipe.

11. The gas introduction structure of claim 1, wherein the discharge part is welded to the gas introduction pipe.

12. The gas introduction structure of claim 1, wherein the gas introduction pipe is inserted from a lower portion of the process chamber, and extends upward in the process chamber.

13. The gas introduction structure of claim 1, wherein the gas introduction pipe is inserted from a lower side of the process chamber, and horizontally extends in the process chamber.

14. The gas introduction structure of claim 1, wherein an inert gas is supplied to the gas introduction pipe, and the porous portion discharges the inert gas.

15. A treatment apparatus comprising: a process chamber; and a gas introduction structure configured to introduce a gas into the process chamber, the gas introduction structure including: a gas introduction pipe inserted in the process chamber; and a discharge part covering an end portion of the gas introduction pipe at a side of the process chamber, and configured to discharge a gas supplied to the gas introduction pipe into the process chamber, wherein the discharge part comprises an installed porous portion formed of a porous body, and a dense portion disposed at a location closer to a leading end of the discharge part than the porous portion and having a porosity lower than that of the porous portion, wherein the porous body is formed of a quartz-glass porous body, wherein the dense portion is formed of a densified quartz-glass porous body obtained by sintering the quartz-glass porous body, and wherein, after installing the quartz-glass porous body covering the end portion of the gas introduction pipe, sintering a part of a leading end portion of the quartz-glass porous body, whereby a non-sintered part forms the porous portion and a sintered part forms the dense portion.

16. A gas introduction structure comprising:
   a gas introduction pipe inserted in a process chamber; and
   a discharge part covering an end portion of the gas introduction pipe at a side of the process chamber, and configured to discharge a gas supplied to the gas introduction pipe into the process chamber,
   wherein the discharge part comprises a porous portion formed of a porous body, and a dense portion disposed at a location closer to a leading end of the discharge part than the porous portion and having a porosity lower than that of the porous portion,
   wherein the porous body is formed of a quartz-glass porous body, and
   wherein the dense portion is formed by welding a quartz bar to an end of the porous portion.

\* \* \* \* \*